United States Patent
Ho et al.

(10) Patent No.: US 7,889,572 B2
(45) Date of Patent: Feb. 15, 2011

(54) MEMORY WITH HIGH READING PERFORMANCE AND READING METHOD THEREOF

(75) Inventors: Wen-Chiao Ho, Guanmiao Township, Tainan County (TW); Chin-Hung Chang, Tainan (TW); Kuen-Long Chang, Taipei (TW); Chun-Hsiung Hung, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 240 days.

(21) Appl. No.: 12/204,009

(22) Filed: Sep. 4, 2008

(65) Prior Publication Data

US 2010/0054045 A1     Mar. 4, 2010

(51) Int. Cl.
*G11C 7/00* (2006.01)

(52) U.S. Cl. .................. 365/189.05; 365/189.06; 365/203

(58) Field of Classification Search .......... 365/189.05, 365/189.06, 203
See application file for complete search history.

(56) References Cited

U.S. PATENT DOCUMENTS

| | | | |
|---|---|---|---|
| 6,995,999 B2 * | 2/2006 | Morimoto | 365/148 |
| 7,330,377 B2 * | 2/2008 | Hosono et al. | 365/185.25 |
| 7,333,371 B2 * | 2/2008 | Hosono | 365/189.05 |
| 7,660,148 B2 * | 2/2010 | Yokoi | 365/148 |

* cited by examiner

*Primary Examiner*—Connie C Yoha
(74) *Attorney, Agent, or Firm*—Thomas, Kayden, Horstemeyer & Risley

(57) ABSTRACT

A memory includes many memory regions each including a target memory cell, a source line, a bit line and a reading control circuit. The source line is coupled to a first terminal of the target memory cell. The bit line is coupled to a second terminal of the target memory cell. The reading control circuit is for selectively applying a working voltage to the source line.

16 Claims, 5 Drawing Sheets

MEMORY WITH HIGH READING PERFORMANCE AND READING METHOD THEREOF

BACKGROUND OF THE INVENTION

1. Field of the Invention

The invention relates in general to a memory and a reading method thereof, and more particularly to a memory and a reading method thereof capable of enhancing the reading performance.

2. Description of the Related Art

NAND memories are widely applied to various data storage occasions. FIG. 1 (Prior Art) is a partial circuit diagram showing a conventional NAND memory 100. Referring to FIG. 1, the NAND memory 100 includes multiple columns of memory cells, such as the non-limitative three columns of memory cells shown in FIG. 1. First ends of the columns of memory cells are respectively coupled to corresponding bit lines BL1 to BL3, and second ends of the columns of memory cells are coupled to a source line SL. If each column of memory cells includes 32 memory cells, the 32 memory cells are respectively coupled to corresponding word lines WL0 to WL31.

In a conventional memory reading method, the source line SL is substantially coupled to a ground voltage GND, and the source line SL substantially has resistors R1, R2 and R3. Illustrations will be made by taking the memory cell 110 as an example. If the memory cell 110 is programmed first while the other memory cells 120 and 130 are still being the low-threshold status, the high cell current of the memory cells 120 and 130 will charge the source-line resistors R1 and R2 during the program-verify phase, so the voltage of node A will be charged up. As a result, the higher voltage of node A will suppress the cell current of the memory cell 110 since the cell current is proportional to the voltage different between word line (WL0) and source line. That is to say that the cell current I1 might be small enough to pass the program-verify of the memory cell 110, however, this is not because the threshold voltage of the memory cell 110 is programmed high enough, but is because the voltage of source-side of the memory cell 110 is too high which is affected by the other memory cells 120 and 130. As a sequence, if the memory cell of 120 and 130 are programmed later during other programming phase, the cell currents I2 and I3 will become small after the memory cells 120 and 130 pass the program-verify phase of them. Consequently, if a read operation is executed to the memory cell 110, the cell current I1 of the memory cell 110 will not as small as being treated as a high-threshold voltage cell since the enough high threshold voltage of the memory cell 110 during previous programming phase is a false appearance. The memory cell 110 never be programmed actually to a high-threshold voltage cell.

In addition, when the memory cell 110 is finished the program operation, the cell current of it might be as large as "1" cell or as small as "0" cell depending on the program-pattern. However, if any program operation is executed latter to the memory cells 140 and 150 which are belonged to the same string of the memory cell 110, the cell current I1 of the memory 110 will be changed smaller because the memory cells 140 and 150 will become a larger series-connected resister.

SUMMARY OF THE INVENTION

The invention is directed to a memory and a reading method thereof, in which a working voltage is applied to a source line to reduce the fluctuation of the voltage level of the source line and enhance the performance of reading the memory.

According to a first aspect of the present invention, a memory is provided. The memory includes many memory regions each including a target memory cell, a source line, a bit line and a reading control circuit. The source line is coupled to a first terminal of the target memory cell. The bit line is coupled to a second terminal of the target memory cell. The reading control circuit is for selectively applying a working voltage to the source line.

According to a second aspect of the present invention, a memory reading method is provided. The memory includes many memory regions each including a target memory cell, a source line coupled to a first terminal of the target memory cell, and a bit line coupled to a second terminal of the target memory cell and a sensing node. The memory reading method includes the following steps. The bit line is discharged. The sensing node is charged up. A working voltage is applied to the source line. The sensing node is sensed.

The invention will become apparent from the following detailed description of the preferred but non-limiting embodiments. The following description is made with reference to the accompanying drawings.

DETAILED DESCRIPTION OF THE INVENTION

The invention provides a memory and a reading method thereof, in which a working voltage is applied to a source line to reduce the fluctuation of the voltage level of the source line, and the source line is regarded as a drain of a target memory cell to read the target memory cell and thus enhance the performance of reading the memory.

Figure 1:
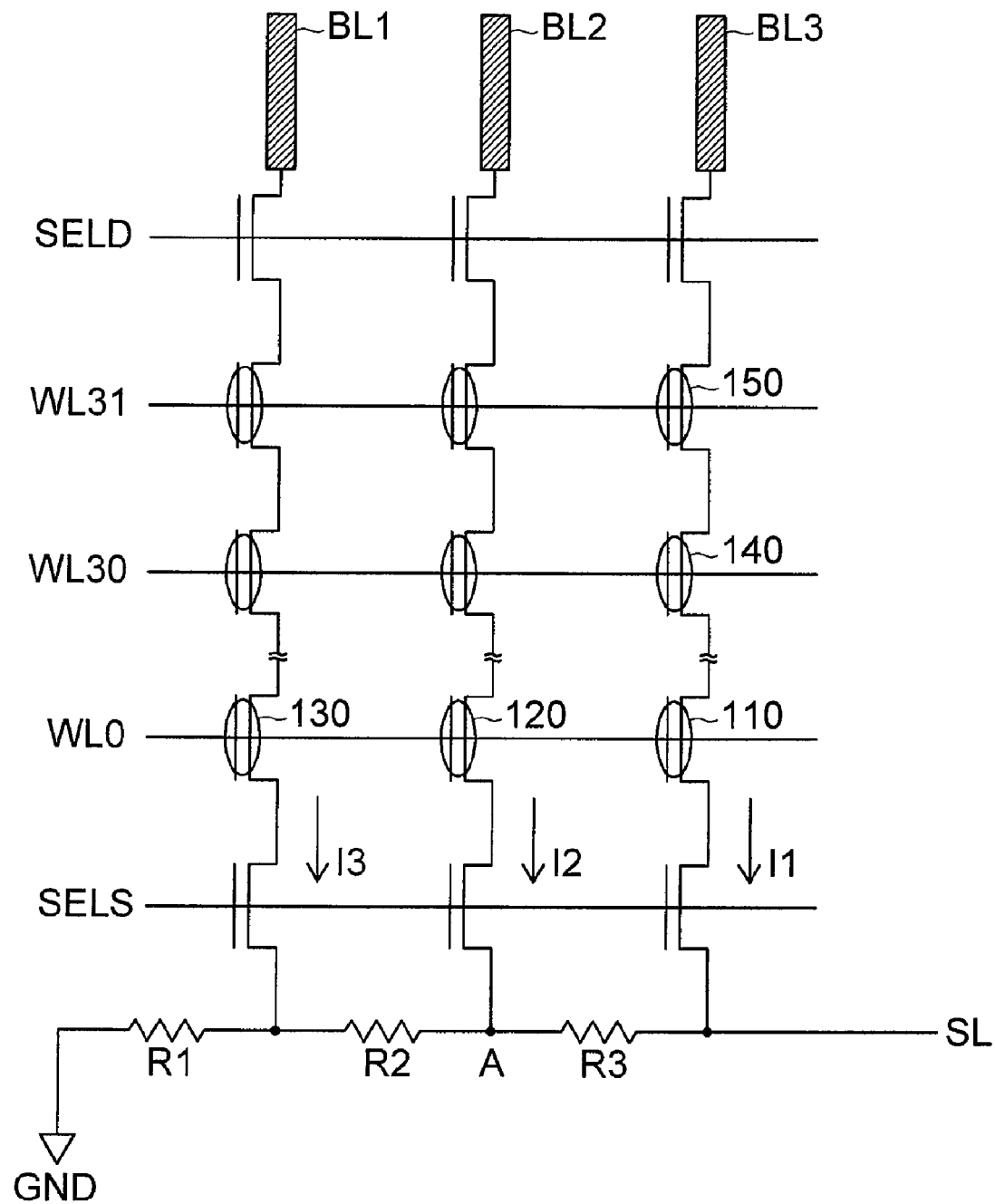
FIG. 1 (Prior Art) is a partial circuit diagram showing a conventional NAND memory.
Figure 2:
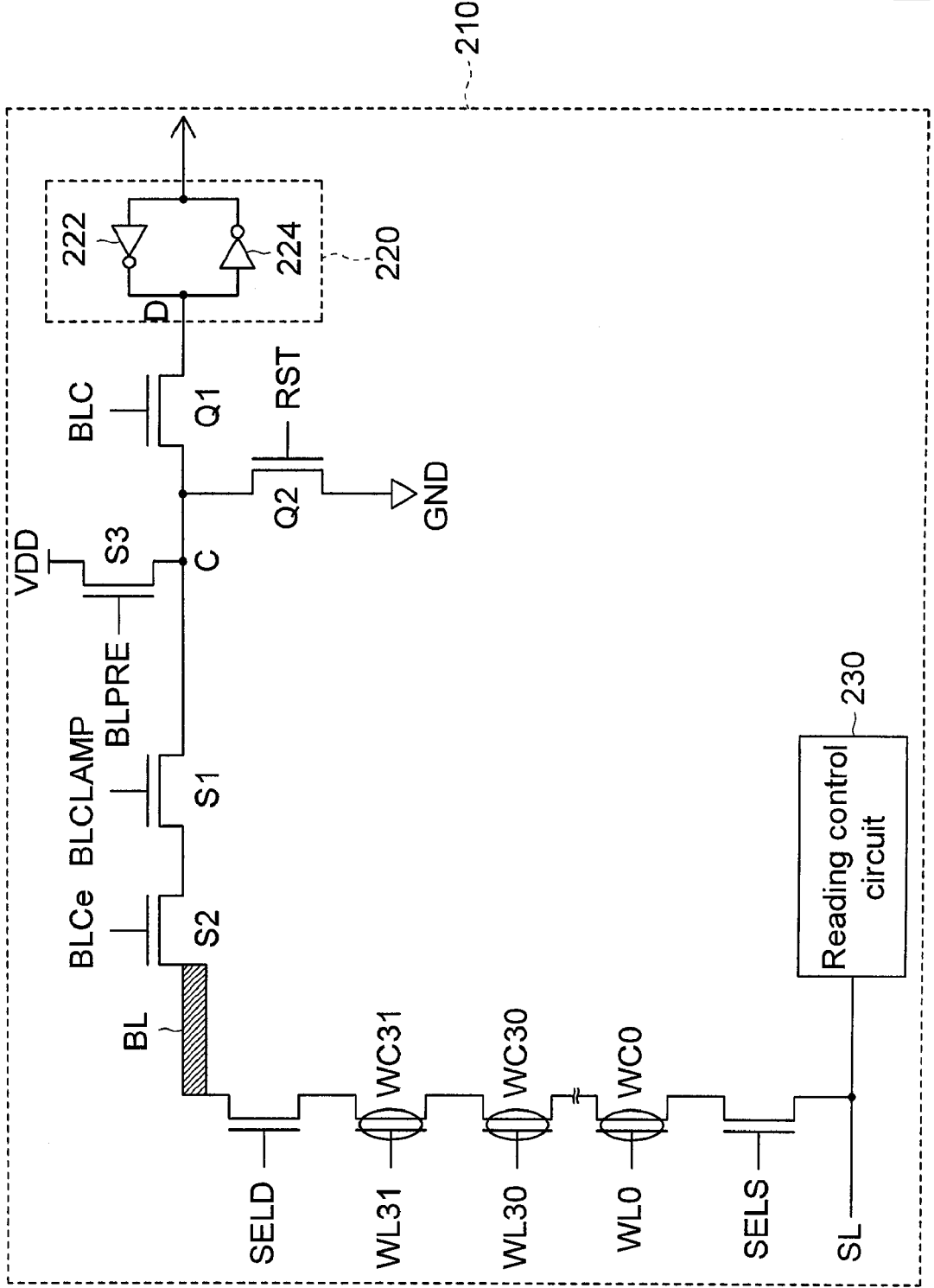
FIG. 2 is a partial circuit diagram showing a memory according to a preferred embodiment of the invention.

The invention will be described according to a memory, which is a NAND memory. However, the memory may also be any other type of memory. FIG. 2 is a partial circuit diagram showing a memory 200 according to a preferred embodiment of the invention. Referring to FIG. 2, the memory 200 includes many memory regions 210 each including one column of memory cells MC0 to MC31, a source line SL, a bit line BL, a clamp transistor S1, a latch 220 and a reading control circuit 230. The column of memory cells MC0 to MC31 includes a target memory cell. The source line SL is coupled to one end of the memory cells MC0 to MC31, and the bit line BL is coupled to the other end of the memory cells MC0 to MC31. The first terminal of the clamp transistor S1 is coupled to the bit line BL. The latch 220 is coupled to the second terminal of the clamp transistor S1. The reading control circuit 230 is coupled to the source line SL and for selectively applying a working voltage to the source line SL.

Each memory region 210 further includes a select transistor S2, a pre-charge transistor S3, a select switch Q1 and a reset switch Q2. The select transistor S2 for selecting the bit line BL has a first terminal coupled to the bit line BL, and a second terminal coupled to the first terminal of the clamp transistor S1. The pre-charge transistor S3 has a first terminal for receiving a working voltage VDD, and a second terminal coupled to the second terminal (i.e., sensing node C) of the clamp transistor S1. The select switch Q1 has a first terminal coupled to the second terminal of the clamp transistor S1, and a second terminal coupled to the latch 220.

The reset switch Q2 has a first terminal coupled to the second terminal (i.e., sensing node C) of the clamp transistor S1, and a second terminal for receiving a ground voltage GND. The latch 220 includes a first inverter 222 and a second inverter 224. An output terminal of the first inverter 222 is coupled to the second terminal of the select switch Q1 and an input terminal (i.e., node D) of the second inverter 224. An input terminal of the first inverter 222 is coupled to an output terminal of the second inverter 224.

Figure 3:
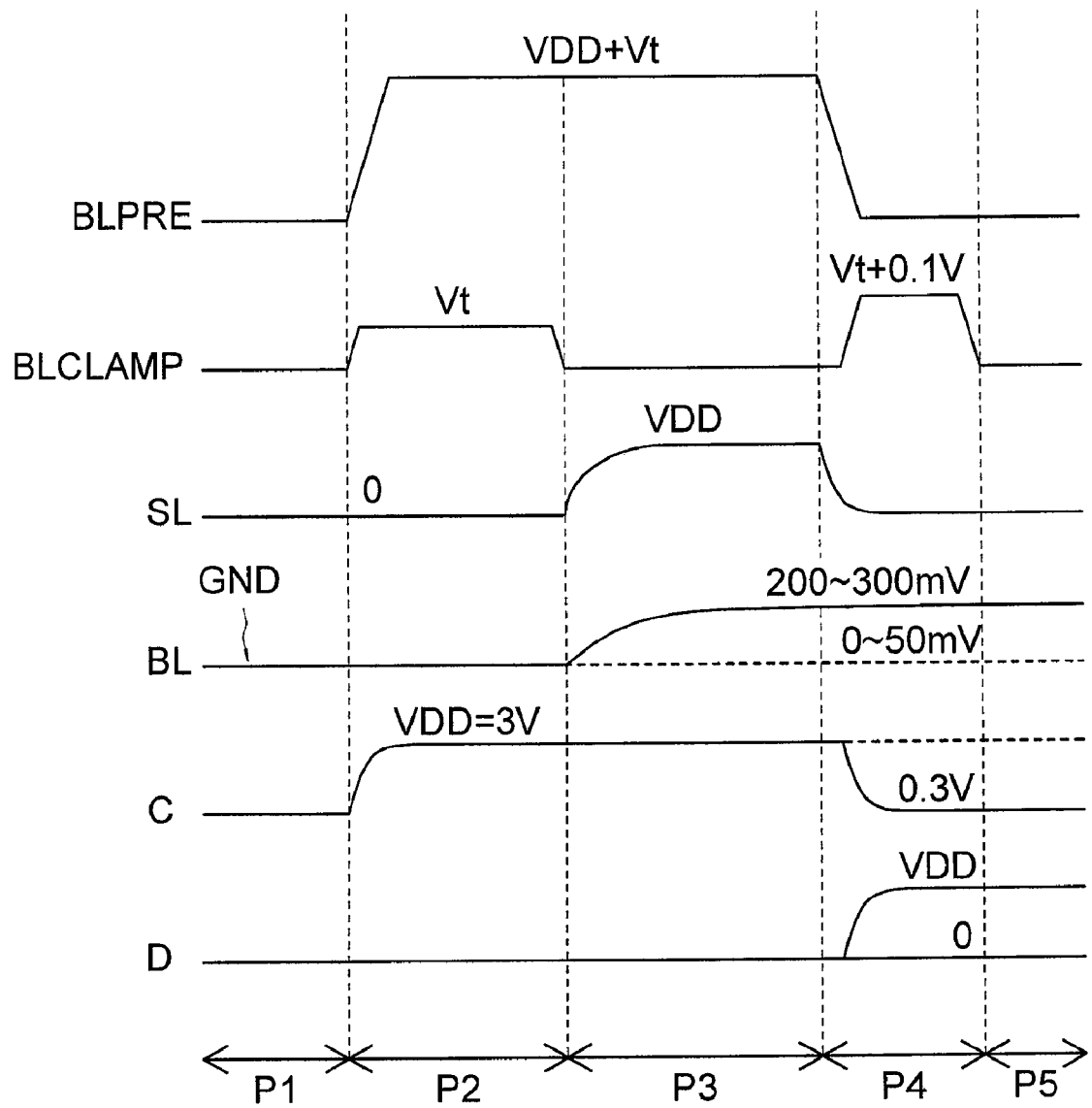
FIG. 3 shows a timing chart applied to a memory reading method according to an example of the preferred embodiment of the invention.

Next, illustrations will be made by taking the memory cell MC0 serving as the target memory cell as an example. FIG. 3 shows a timing chart applied to a memory reading method according to an example of the preferred embodiment of the invention. First, in a discharge period P1, a control signal BLPRE turns off the pre-charge transistor S3, and the reset signal turns on the reset switch Q2. Meanwhile, the voltage levels of the local bit line of every cell, the global bit line and the sensing node C are discharged to the ground voltage GND.

Next, in a pre-charge period P2, the reset switch Q2 is turned off and the control signal BLPRE turns on the pre-charge transistor S3 such that the voltage level of the second terminal of the clamp transistor S1 turns into the working voltage VDD. That is, the voltage level of the sensing node C turns into the working voltage VDD, such as 3 volts. At this time, the control signal BLCLAMP turns into a threshold voltage Vt of the clamp transistor S1. Because the voltage level of the bit line BL is the ground voltage GND, the clamp transistor S1 is turned on, and the bit line BL is slightly charged up to a low voltage, which is associated with the threshold voltage Vt and is about 0 to 50 millivolts, for example.

Then, in a signal developing period P3, the control signal BLCLAMP turns off the clamp transistor S1 and the working voltage VDD is applied to the source line SL by the reading control circuit 230. At this time, the source line SL is regarded as a drain of the target memory cell MC0 to read the target memory cell MC0. If the target memory cell MC0 is erased, the bit line BL is charged up about 200 to 300 millivolts. If the target memory cell MC0 is programmed, the bit line BL is kept at the low voltage (dashed line portion), which is about 0 to 50 millivolts.

Next, in a sensing period P4, the voltage level of the second terminal (sensing node C) of the clamp transistor S1 is determined according to the voltage level of the bit line BL. In the sensing period P4, the control signal BLCLAMP turns into a summed voltage equal to a sum of the threshold voltage Vt of the clamp transistor S1 and a specific voltage (e.g., 0.1 volts), and the ground voltage GND is applied to the source line SL. During this period, since the different cell statuses already develop the voltage difference in the BL side at the previous period P3, the source line SL and the control signal SELS can be applied to the ground voltage GND to turn off the connection of source-line SL and the cell string in order to save power. If the target memory cell MC0 is erased, the bit line BL is charged up in the signal developing period P3, the clamp transistor S1 is not turned on, and the voltage level of the second terminal (sensing node C) of the clamp transistor S1 is kept at the working voltage VDD (dashed line portion). If the target memory cell MC0 is programmed, the bit line BL is kept at the low voltage in the signal developing period P3, the clamp transistor S1 is turned on, and the voltage level of the second terminal (sensing node C) of the clamp transistor S1 is lowered to about 0.3 volts.

Thereafter, in a latching period P5, the select switch Q1 turns on, the voltage level of the node D approximates to the voltage level of the sensing node C, and the latch 220 reads and outputs the state of the target memory cell MC0 according to the voltage level of the node D.

In the above-mentioned memory reading method, the threshold voltages of many clamp transistors S1 corresponding to multiple columns of memory cells in the memory region 210 may be different from each other. So, the control signal BLCLAMP turns into the threshold voltage Vt in the pre-charge period P2, and the control signal BLCLAMP turns into the summed voltage equal to the sum of the threshold voltage Vt and the specific voltage in the sensing period P4. Thus, it is possible to ensure that all the clamp transistors S1 corresponding to the programmed target memory cells are turned on in the sensing period P4. If the threshold voltages of the clamp transistors S1 corresponding to multiple columns of memory cells in the memory region 210 are the same, the memory reading method mentioned hereinabove may be further simplified.

Figure 4:
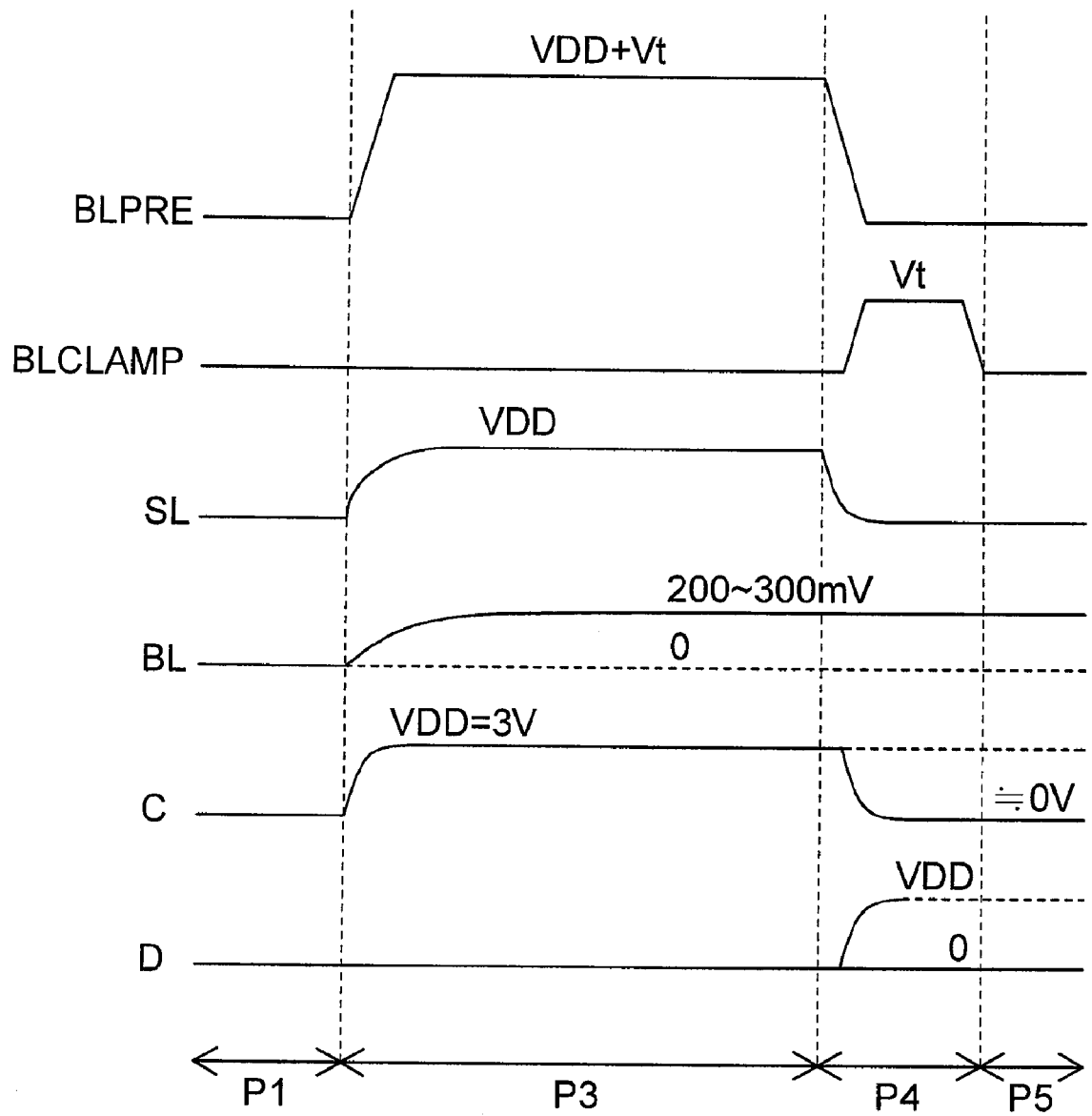
FIG. 4 shows a timing chart applied to a memory reading method according to another example of the preferred embodiment of the invention.

FIG. 4 shows a timing chart applied to a memory reading method according to another example of the preferred embodiment of the invention. Compared with FIG. 3, the pre-charge period P2 is removed from the memory reading method of FIG. 4 such that the procedure directly enters the signal developing period P3. In the signal developing period P3, the reset switch Q2 is turned off and the pre-charge transistor S3 is turned on such that the voltage level of the second terminal (sensing node C) of the clamp transistor S1 is the working voltage VDD. Meanwhile, the control signal BLCLAMP turns off the clamp transistor S1, and the working voltage VDD is applied to the source line SL. If the target memory cell MC0 is erased, the bit line BL is charged up to about 200 to 300 millivolts. If the target memory cell MC0 is programmed, the bit line BL is kept at the ground voltage GND (dashed line portion).

In addition, in the sensing period P4, the control signal BLCLAMP applies the threshold voltage Vt of the clamp transistor S1 to the clamp transistor S1, and the ground voltage GND is applied to the source line SL. If the bit line BL is charged up in the signal developing period P3, the clamp transistor S1 is not turned on, and the voltage level of the second terminal (sensing node C) of the clamp transistor S1 is kept at the working voltage VDD (dashed line portion). If the bit line BL is kept at the ground voltage GND in the signal developing period P3, the clamp transistor S1 is turned on, and the voltage level of the second terminal (sensing node C) of the clamp transistor S1 turns into the ground voltage GND. Thereafter, in the latching period P5, the select switch Q1 is turned on, the voltage level of the node D approximates to the voltage level of the sensing node C, and the latch 220 reads and outputs the state of the target memory cell MC0 according to the voltage level of the node D.

Figure 5:
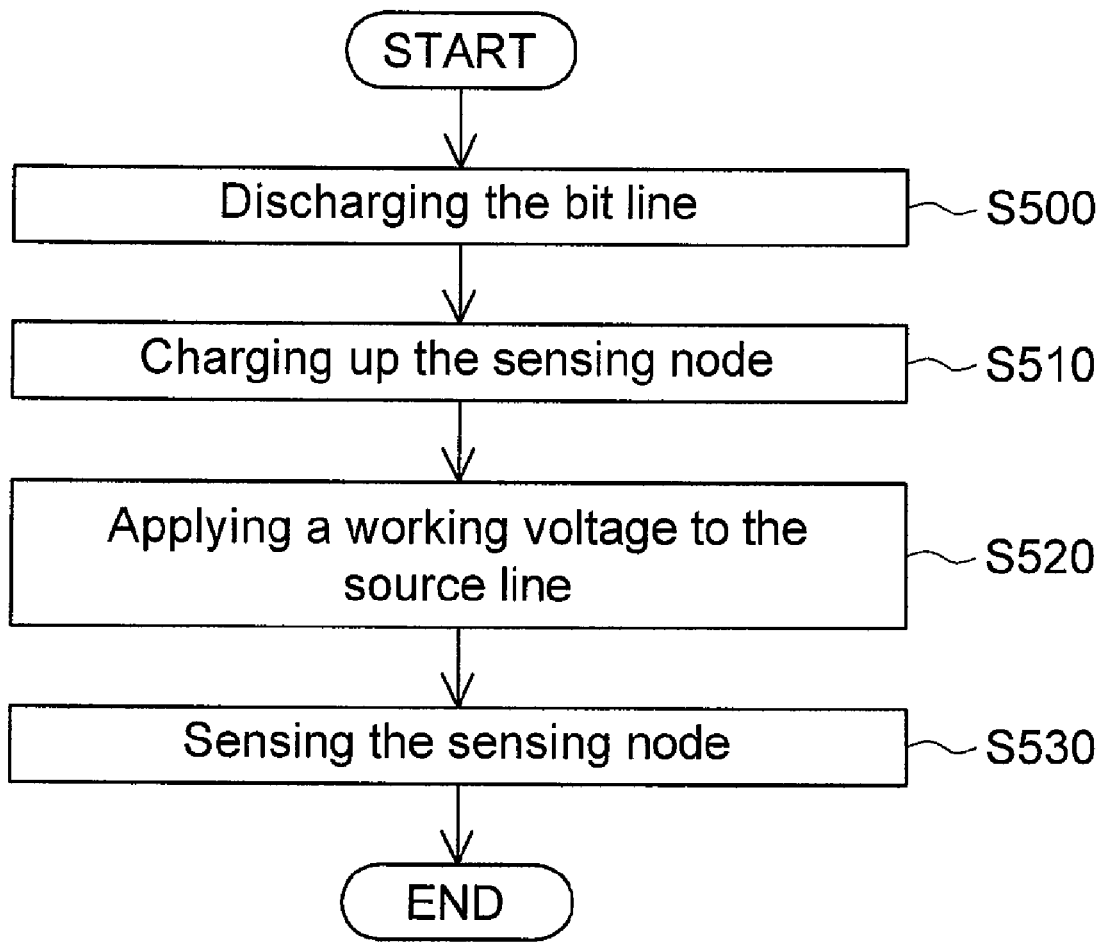
FIG. 5 shows a flow chart showing a memory reading method according to a preferred embodiment of the invention.

In addition, the invention further provides a memory reading method. The memory includes many memory regions each including a target memory cell, a source line coupled to a first terminal of the target memory cell, and a bit line coupled to a second terminal of the target memory cell and a sensing node. Referring to FIG. 5, a flow chart showing a memory reading method according to a preferred embodiment of the invention is shown. In step S500, the bit line is discharged. In step S510, the sensing node is charged up. In step S520, a working voltage is applied to the source line. In step S530, the sensing node is sensed. The operational principles of the memory reading method mentioned above have been described in detail in the memory 200, and are omitted hereinafter.

In the memory and the reading method thereof according to the embodiment of the invention, the working voltage is applied to the source line before the sensing period, and the source line is regarded as the drain of the target memory cell to read the target memory cell. Consequently, the fluctuation of the voltage level of the source line can be reduced, the conventional influence caused by, for example, the source line resistor effect or the program-pattern noise effect can be effectively improved, and the performance of reading the memory can be enhanced. Thus, the reading of the memory has the robustness and it is possible to ensure that the memory has the sufficient read window. In addition, the memory and the reading method thereof according to the embodiment of the invention can achieve the advantages without adding new circuit elements.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A memory, comprising:
a plurality of memory regions each comprising:
a target memory cell;
a source line coupled to a first terminal of the target memory cell;
a bit line coupled to a second terminal of the target memory cell;
a reading control circuit for selectively applying a working voltage to the source line;
a clamp transistor having a first terminal coupled to the bit line;
a latch coupled to a second terminal of the clamp transistor;
a select transistor for selecting the bit line, wherein a second terminal of the select transistor is coupled to the first terminal of the clamp transistor;
a pre-charge transistor having a first terminal for receiving the working voltage, and a second terminal coupled to the second terminal of the clamp transistor;
a select switch having a first terminal coupled to the second terminal of the clamp transistor, and a second terminal coupled to the latch; and
a reset switch having a first terminal coupled to the second terminal of the clamp transistor, and a second terminal for receiving a ground voltage.

2. The memory according to claim 1, wherein:
in a signal developing period, the clamp transistor is turned off and the working voltage is applied to the source line such that the bit line is charged up or a voltage level of the bit line is kept unchanged according to the target memory cell; and
in a sensing period, a voltage level of the second terminal of the clamp transistor is determined according to the voltage level of the bit line such that the latch reads the target memory cell according to the voltage level of the second terminal of the clamp transistor in a latching period.

3. The memory according to claim 2, wherein in a discharge period, the bit line is discharged to the ground voltage, and the reset switch is turned on such that the voltage level of the second terminal of the clamp transistor is the ground voltage.

4. The memory according to claim 3, wherein in a pre-charge period, the reset switch is turned off and the pre-charge transistor is turned on such that the voltage level of the second terminal of the clamp transistor is the working voltage, and the clamp transistor is turned on by a threshold voltage of the clamp transistor such that the bit line has a low voltage.

5. The memory according to claim 4, wherein in the signal developing period, the clamp transistor is turned off and the working voltage is applied to the source line, wherein the bit line is charged up if the target memory cell is erased, and the bit line is kept at the low voltage if the target memory cell is programmed.

6. The memory according to claim 5, wherein in the sensing period, a summed voltage equal to a sum of the threshold voltage and a specific voltage is applied to the clamp transistor, and the ground voltage is applied to the source line, wherein the clamp transistor is turned off and the voltage level of the second terminal of the clamp transistor is kept at the working voltage if the bit line is charged up, and the clamp transistor is turned on and the voltage level of the second terminal of the clamp transistor is lowered if the bit line is kept at the low voltage.

7. The memory according to claim 3, wherein:
in the signal developing period, the reset switch is turned off and the pre-charge transistor is turned on such that the voltage level of the second terminal of the clamp transistor is the working voltage, the clamp transistor is turned off, and the working voltage is applied to the source line;
if the target memory cell is erased, the bit line is charged up; and
if the target memory cell is programmed, the bit line is kept at the ground voltage.

8. The memory according to claim 7, wherein:
in the sensing period, a threshold voltage of the clamp transistor is applied to the clamp transistor, and the ground voltage is applied to the source line;
if the bit line is charged up, the clamp transistor is turned off, and the voltage level of the second terminal of the clamp transistor is kept at the working voltage; and
if the bit line is kept at the ground voltage, the clamp transistor is turned on, and the voltage level of the second terminal of the clamp transistor turns into the ground voltage.

9. The memory according to claim 2, wherein the latch comprises a first inverter and a second inverter, an output terminal of the first inverter is coupled to the second terminal of the select switch and an input terminal of the second inverter, and an input terminal of the first inverter is coupled to an output terminal of the second inverter.

10. A memory reading method for reading a memory, which comprises a plurality of memory regions each comprising a target memory cell, a source line coupled to a first terminal of the target memory cell, a bit line coupled to a second terminal of the target memory cell and a sensing node, a clamp transistor having a first terminal coupled to the bit line, a latch coupled to a second terminal of the clamp transistor, a select transistor for selecting the bit line and having a second terminal coupled to the first terminal of the clamp transistor, a pre-charge transistor having a first terminal for receiving the working voltage, and a second terminal coupled to the second terminal of the transistor, a select switch having a first terminal coupled to the second terminal of the clamp transistor, and a second terminal coupled to the latch, and a reset switch having a first terminal coupled to the second terminal of the clamp transistor, and a second terminal for receiving a ground voltage, the memory reading method comprising the steps of:

discharging the bit line to the ground voltage and turning on the reset switch in a discharge period such that the voltage level of the second terminal of the clamp transistor is the ground voltage;

charging up the sensing node;

applying a working voltage to the source line; and sensing the sensing node.

11. The method according to claim 10, further comprising the steps of:

turning off the clamp transistor and applying the working voltage to the source line in a signal developing period such that the bit line is charged up or a voltage level of the bit line is kept unchanged according to the target memory cell;

determining a voltage level of the second terminal of the clamp transistor according to the voltage level of the bit line in a sensing period; and using the latch to read the target memory cell according to the voltage level of the second terminal of the clamp transistor in a latching period.

12. The method according to claim 11, further comprising the step of:

turning off the reset switch and turning on the pre-charge transistor in a pre-charge period such that the voltage level of the second terminal of the clamp transistor is the working voltage, and the clamp transistor is turned on by a threshold voltage of the clamp transistor such that the bit line has a low voltage.

13. The method according to claim 12, wherein in the signal developing period, the clamp transistor is turned off and the working voltage is applied to the source line, the bit line is charged up if the target memory cell is erased, and the bit line is kept at the low voltage if the target memory cell is programmed.

14. The method according to claim 13, wherein:

in the sensing period, a summed voltage equal to a sum of the threshold voltage and a specific voltage is applied to the clamp transistor, and the ground voltage is applied to the source line;

the clamp transistor is turned off and the voltage level of the second terminal of the clamp transistor is kept at the working voltage if the bit line is charged up; and the clamp transistor is turned on and the voltage level of the second terminal of the clamp transistor is lowered if the bit line is kept at the low voltage.

15. The method according to claim 11, further comprising the step of:

turning off the reset switch and turning on the pre-charge transistor in the signal developing period such that the voltage level of the second terminal of the clamp transistor is the working voltage; and turning off the clamp transistor and applying the working voltage to the source line in the signal developing period, wherein the bit line is charged up if the target memory cell is erased, and the bit line is kept at the ground voltage if the target memory cell is programmed.

16. The method according to claim 15, wherein:

in the sensing period, the threshold voltage is applied to the clamp transistor and the ground voltage is applied to the source line;

the clamp transistor is turned off and the voltage level of the second terminal of the clamp transistor is kept at the working voltage if the bit line is charged up, and the clamp transistor is turned on and the voltage level of the second terminal of the clamp transistor turns into the ground voltage if the bit line is kept at the ground voltage.

* * * * *